US010367404B2

(12) United States Patent
Ozimek et al.

(10) Patent No.: US 10,367,404 B2
(45) Date of Patent: Jul. 30, 2019

(54) MID-BUS VOLTAGE GENERATION VIA IDLE PHASES IN A LINEAR MOTOR TRACK SYSTEM

(71) Applicant: Rockwell Automation Technologies, Inc., Mayfield Heights, OH (US)

(72) Inventors: Patrick E. Ozimek, Milwaukee, WI (US); Jonathan D. Hoffman, Milwaukee, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 133 days.

(21) Appl. No.: 15/720,353

(22) Filed: Sep. 29, 2017

(65) Prior Publication Data

US 2019/0103800 A1 Apr. 4, 2019

(51) Int. Cl.
*G01R 33/09* (2006.01)
*H02K 11/04* (2016.01)
(Continued)

(52) U.S. Cl.
CPC ......... *H02K 41/0358* (2013.01); *G01R 33/09* (2013.01); *G05D 3/1481* (2013.01);
(Continued)

(58) Field of Classification Search
CPC ........ B65G 43/02; B65G 35/06; B65G 54/02; B65G 43/06; B60L 15/005; B60L 13/10; H02P 6/006; H02P 6/00; H02P 7/29; H02P 5/00; H02P 41/02; H02P 1/00; H02P 3/00; H02P 7/00; G05B 19/0421; G05B 11/00; G05B 11/28; H02K 41/00

USPC .... 318/687, 38, 135, 400.01, 700, 701, 727, 318/799, 800, 801, 430; 363/21.1, 40, 363/44, 95, 120, 175; 361/20, 30
See application file for complete search history.

(56) References Cited

U.S. PATENT DOCUMENTS 5,825,641 A 10/1998 Mangtani
7,026,732 B1 4/2006 Backman et al.
(Continued)

FOREIGN PATENT DOCUMENTS

EP 3301809 4/2018

OTHER PUBLICATIONS

Extended European Search Report dated Jan. 28, 2019 (13 pages).

*Primary Examiner* — Antony M Paul
(74) *Attorney, Agent, or Firm* — Boyle Fredrickson, S.C.

(57) ABSTRACT

Drive coils in sections of a linear motor track that are normally used to electromagnetically propel movers along the track when such movers are nearby can be used to generate a mid-bus voltage for the section when not being used to propel movers. Such drive coils not being used to propel movers are considered "idle" and available for mid-bus voltage generation. The mid-bus voltage, and a full-bus voltage from which the mid-bus voltage is derived, in turn, can be applied across other drive coils that are near movers with varying polarities and magnitudes to propel movers along the track. Track sensors can be positioned along the track to detect presences or absences of movers with respect to drive coils for determining propulsion of such movers or generation of the mid-bus voltage. Accordingly, power supplies can be used more efficiently by not requiring them to generate mid-bus voltages in addition to full-bus voltages and DC references.

18 Claims, 9 Drawing Sheets

(51) Int. Cl.
    *H02P 7/292*       (2016.01)
    *H02K 11/215*     (2016.01)
    *G05D 3/14*        (2006.01)
    *H02K 41/035*     (2006.01)

(52) U.S. Cl.
    CPC ........... *H02K 11/04* (2013.01); *H02K 11/215* (2016.01); *H02P 7/292* (2013.01)

(56) References Cited

U.S. PATENT DOCUMENTS

| | | | |
|---|---|---|---|
| RE39,747 E * | 7/2007 | Peltier | 310/12.11 |
| 2019/0077608 A1 * | 3/2019 | Huang | H02P 6/006 |
| 2019/0078950 A1 * | 3/2019 | Huang | G01L 5/0028 |

* cited by examiner

MID-BUS VOLTAGE GENERATION VIA IDLE PHASES IN A LINEAR MOTOR TRACK SYSTEM

BACKGROUND INFORMATION

The present invention relates to motion control systems and, more specifically, to motion control systems including a track segment for linear motor drive systems supporting movers on tracks in which switches corresponding to drive coils are controlled to electromagnetically propel the movers along the track.

Motion control systems utilizing movers and linear motors can be used in a wide variety of processes (e.g. packaging, manufacturing, and machining) and can provide an advantage over conventional conveyor belt systems with enhanced flexibility, extremely high speed movement, and mechanical simplicity. The motion control system includes a set of independently controlled "movers" each supported on a track for motion along the track. The track is made up of a number of track segments or sections that, in turn, hold individually controllable electric coils. Successive activation of the coils establishes a moving electromagnetic field that interacts with the movers and causes the mover to travel along the track. Sensors, such as Hall Effect sensors or Magnetoresistance sensors, may be spaced at fixed positions along the track and/or on the movers for detecting opposing magnets to provide information about the position and speed of the movers.

Each of the movers may be independently moved and positioned along the track in response to the moving electromagnetic field generated by the coils. In a typical system, the track forms a closed path over which each mover repeatedly travels. At certain positions along the track other actuators may interact with each mover. For example, the mover may be stopped at a loading station at which a first actuator places a product on the mover. The mover may then be moved along a process segment of the track where various other actuators may fill, machine, position, or otherwise interact with the product on the mover. The mover may be programmed to stop at various locations or to move at a controlled speed past each of the other actuators. After the various processes are performed, the mover may pass or stop at an unloading station at which the product is removed from the mover. The mover then completes a cycle along the closed path by returning to the loading station to receive another unit of the product.

A DC (Direct Current) power supply is typically used to provide DC power to sections in the system. The DC power supply typically provides a full-bus DC power rail ("full-bus"), a mid-bus DC power rail ("mid-bus") equal to about half the full-bus, and a DC reference. To propel the movers, switches are used to activate the drive coils with varying polarities and magnitudes between the full-bus and the DC reference, with currents bi-directionally sourcing or sinking with respect to the mid-bus. It is desirable to continuously improve the efficiency of this system where possible.

BRIEF DESCRIPTION

Drive coils in sections of a linear motor track that are normally used to electromagnetically propel movers along the track when such movers are nearby can be used to generate a raid-bus voltage for the section when not being used to propel movers. Such drive coils not being used to propel movers are considered "idle" and available for mid-bus voltage generation. The mid-bus voltage, and a full-bus voltage from which the mid-bus voltage is derived, in turn, can be applied across other drive coils that are near movers with varying polarities and magnitudes to propel movers along the track. Track sensors can be positioned along the track to detect presences or absences of movers with respect to drive coils for determining propulsion of such movers or generation of the mid-bus voltage. Accordingly, power supplies can be used more efficiently by not requiring them to generate mid-bus voltages in addition to full-bus voltages and DC references.

In one aspect, half-bridge inverters can be used to drive stator coils to reduce the cost of the system. This may require each drive coil to be connected to the mid-bus DC voltage, which should be equal to half of the full-bus DC voltage provided by the power supply, in order to drive bidirectional current in the drive coils. This mid-bus voltage rail can, in many cases, provide significant current, particularly if the sum of the drive coil currents is non-zero, which may often result from a linear motor track system which may be optimized for maximum force for an amount of current. Accordingly, an improved way for generating the mid-bus voltage can be provided in which un-used motor phases (switching legs having drive coils) can dynamically transition between force commutation for movers and mid-bus voltage generation/regulation. In an alternative aspect, full-bridge inverters can be used to drive the stator coils.

In another aspect, the full-bus voltage can be electrically isolated between track sections, while the mid-bus voltages can be electrically joined between track sections. This may be desirable when a single large track might exceed a power rating for a single full bus voltage supply. In such a case, some modular sections of the track could be connected to a first full bus voltage supply, while other modular sections of the track are connected to a second full bus voltage supply. This can allow a dedicated power supply for a track section, while sharing the responsibility for mid-bus generation among multiple track sections, so that multiple movers on a single track section, utilizing most or all of the drive coils, would not cause that track section to lose the mid-bus voltage.

Specifically then, one aspect of the present invention provides: a linear motor drive system including: a DC power supply configured to provide: a first DC voltage rail providing a full bus voltage; and a DC reference; and a track segment defining a path along which a mover travels, the track segment receiving power from the DC power supply for electromagnetically propelling a mover, the track segment including: multiple drive coils spaced along the track segment, the drive coils being coupled to a second DC voltage rail; multiple upper switches arranged between the first DC voltage rail and the drive coils, each upper switch being configured to selectively connect a drive coil to the first DC voltage rail; multiple lower switches arranged between the DC reference and the drive coils, each lower switch being configured to selectively connect a drive coil to the DC reference; and multiple track sensors spaced along the track segment, each track sensor being configured to detect a mover when proximal to a drive coil. Upper and lower switches corresponding to a drive coil can be controlled to provide a mid-bus voltage corresponding to half the full bus voltage through the drive coil to the second DC voltage rail when a track sensor does not detect a mover proximal to the drive coil. Also, the upper and lower switches corresponding to a drive coil can be controlled to provide power to the drive coil between the first and second DC voltage rails to electromagnetically propel a mover when the track sensor detects a mover is proximal to the drive coil.

Another aspect of the present invention provides: a linear motor drive system including: a DC power supply configured to provide: a first DC voltage rail providing a full bus voltage; and a DC reference; multiple movers, each mover including at least one position magnet; and a track segment defining a path along which the movers travel, the track segment receiving power from the DC power supply for electromagnetically propelling the movers, the track segment including: multiple drive coils spaced along the track segment, the plurality of drive coils being coupled to a second DC voltage rail; multiple upper switches arranged between the first DC voltage rail and the drive coils, each upper switch being configured to selectively connect a drive coil to the first DC voltage rail; multiple lower switches arranged between the DC reference and the drive coils, each lower switch being configured to selectively connect a drive coil to the DC reference; and multiple track sensors spaced along the track segment, each track sensor being configured to detect a mover when proximal to a drive coil by detecting the at least one position magnet. Upper and lower switches corresponding to a drive coil are controlled to provide a mid-bus voltage corresponding to half the hill bus voltage through the drive coil to the second DC voltage rail when a track sensor does not detect a mover proximal to the drive coil. Also, the upper and lower switches corresponding to a drive coil are controlled to provide power to the drive coil between the first and second DC voltage rails to electromagnetically propel a mover when the track sensor detects a mover is proximal to the drive coil.

In addition, a system controller can be implemented to control the drive coils, such as through segment controllers, to operate together, so that idle drive coils in the system are efficiently used to produce the mid-bus voltage across the track. This may be preferable to attempting to control the drive coils independently from different devices, which could result in slightly different information among the different devices causing the devices to oppose one another. Accordingly, the system controller can provide inter-section communications to coordinate control of the drive coils that are idle, through the segment controllers, for proper voltage regulation.

These and other advantages and features of the invention will become apparent to those skilled in the art from the detailed description and the accompanying drawings. It should be understood, however, that the detailed description and accompanying drawings, while indicating preferred embodiments of the present invention, are given by way of illustration and not of limitation. Many changes and modifications may be made within the scope of the present invention without departing from the spirit thereof, and the invention includes all such modifications.

BRIEF DESCRIPTION OF THE DRAWINGS

Various exemplary embodiments of the subject matter disclosed herein are illustrated in the accompanying drawings in which like reference numerals represent like parts throughout, and in which.

Figure 1:
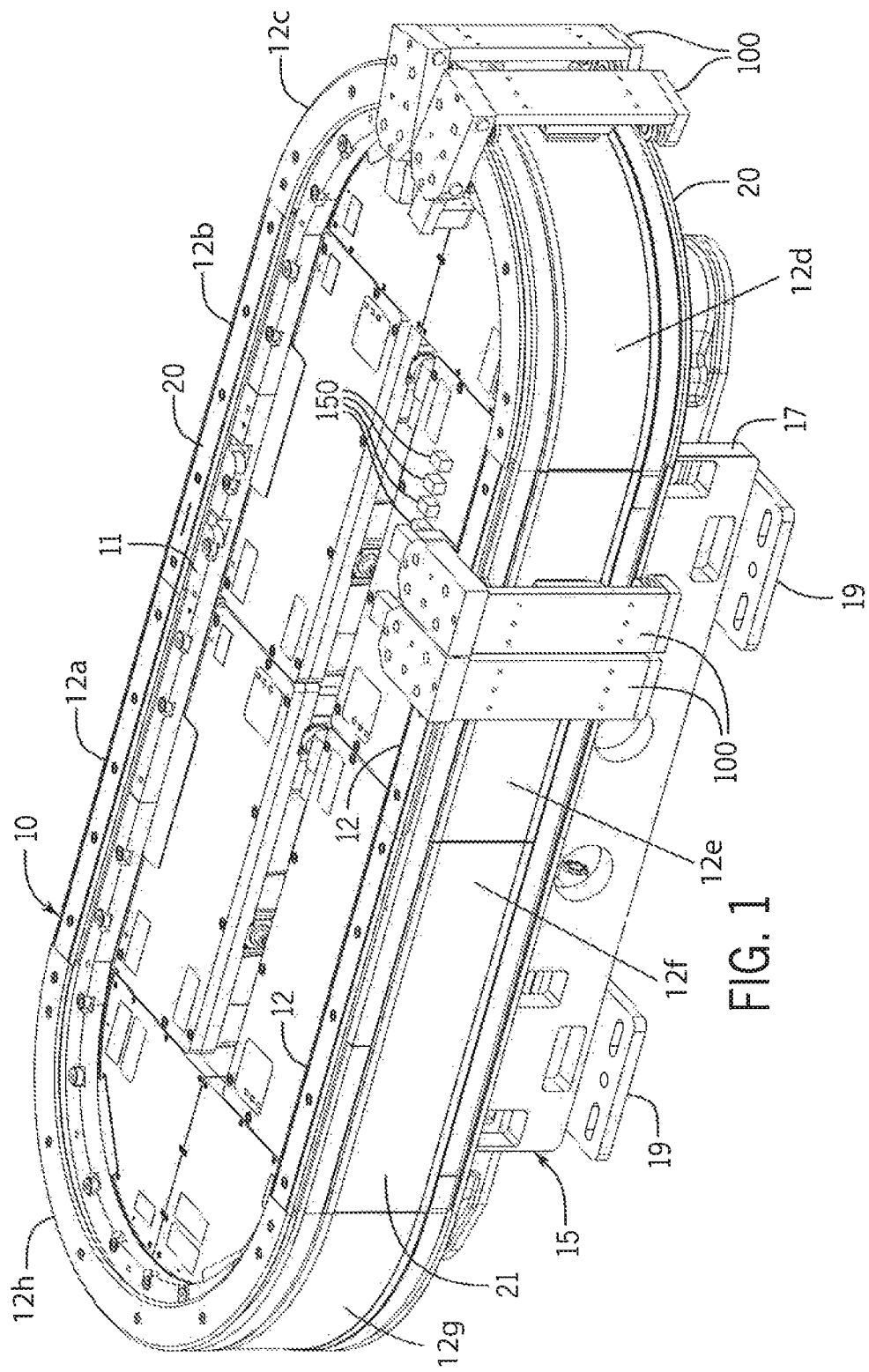
FIG. 1 is an isometric view of an exemplary transport system incorporating multiple movers travelling along a closed curvilinear track according to one embodiment of the present invention.

In describing the various embodiments of the invention which are illustrated in the drawings, specific terminology will be resorted to for the sake of clarity. However, it is not intended that the invention be limited to the specific terms so selected and it is understood that each specific term includes all technical equivalents which operate in a similar manner to accomplish a similar purpose. For example, the word "connected," "attached," or terms similar thereto are often used. They are not limited to direct connection but include connection through other elements where such connection is recognized as being equivalent by those skilled in the art.

DETAILED DESCRIPTION

The various features and advantageous details of the subject matter disclosed herein are explained more fully with reference to the non-limiting embodiments described in detail in the following description.

Turning initially to FIG. 1, an exemplary transport system for moving articles or products includes a track 10 made up of multiple segments 12 or sections, such as segments 12a, 12b, 12c and so forth. According to the illustrated embodiment, the segments 12 define a generally closed loop supporting a set of movers 100 movable along the track 10. The track 10 is oriented in a horizontal plane and supported above the ground by a base 15 extending vertically downward from the track 10. According to the illustrated embodiment, the base 15 includes a pair of generally planar support plates 17, located on opposite sides of the track 10, with mounting feet 19 on each support plate 17 to secure the track 10 to a surface. The illustrated track 10 includes four straight segments 12, with two straight segments 12 located along each side of the track and spaced apart from the other pair, such as straight segments 12a and 12b on a first side of the track 10, opposite straight segments 12e and 12f on a second side of the track 10. The track 10 also includes four curved segments 12 where a pair of curved segments 12 is located at each end of the track 10 to connect the pairs of straight segments 12, such as curved segments 12c and 12d on a first end of the track, opposite curved segments 12g and 12h on a second end of the track 10. As illustrated, the four straight segments 12 and the four curved segments 12 form a generally oval track and define a closed surface over which each of the movers 100 may travel. It is understood that track segments of various sizes, lengths, and shapes may be connected together to form a track 10 without deviating from the scope of the invention.

For convenience, the horizontal orientation of the track 10 shown in FIG. 1 will be discussed herein. Terms such as upper, lower, inner, and outer will be used with respect to the illustrated track orientation. These terms are relational with respect to the illustrated track and are not intended to be limiting. It is understood that the track may be installed in different orientations, such as sloped or vertical, and include different shaped segments including, but not limited to, straight segments, inward bends, outward bends, up slopes, down slopes and various combinations thereof. Further, each track segment 12 is shown in a generally horizontal orientation. The track segments 12 may also be oriented in a generally vertical orientation and the width of the track 10 may be greater in either the horizontal or vertical direction according to application requirements. The movers 100 will travel along the track and take various orientations according to the configuration of the track 10 and the relationships discussed herein may vary accordingly.

Figure 3:
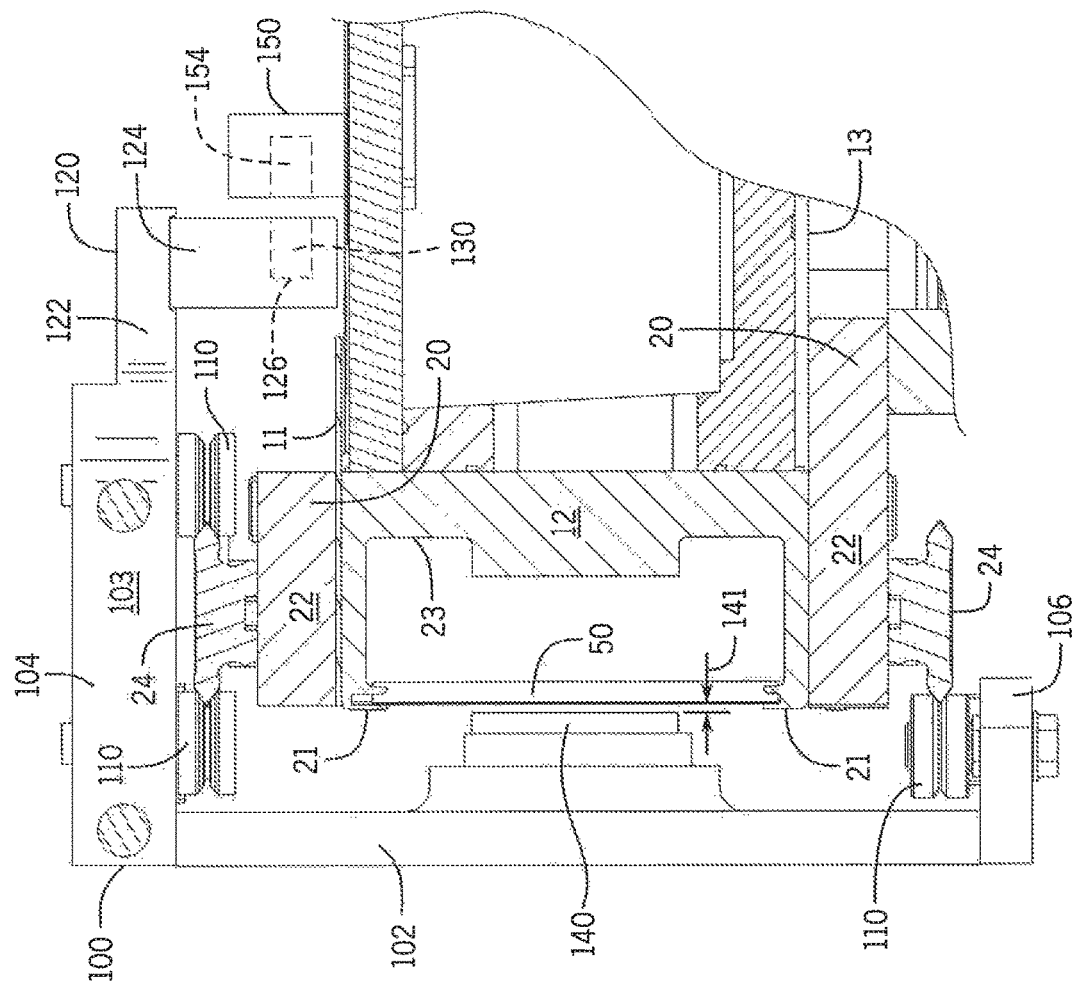
FIG. 3 is a partial sectional view of the transport system of FIG. 1.

Each track segment 12 includes a number of independently attached rails 20 on which each mover 100 runs. According to the illustrated embodiment, rails 20 extend generally along the outer periphery of the track 10. A first rail 20 extends along an upper surface 11 of each segment and a second rail 20 extends along a lower surface 13 of each segment. With reference also to FIG. 3, the illustrated embodiment of each rail 20 includes a base 22 and a track portion 24. The base 22 is secured to the upper surface 11 or lower surface 13 of each segment 12 and the track portion 24 is mounted to the base 22. It is contemplated that each rail 20 may be a singular, molded or extruded member or formed from multiple members. It is also contemplated that the cross section of the rails 20 may be circular, square, rectangular, or any other desired cross-sectional shape without deviating from the scope of the invention. The rails 20 generally conform to the curvature of the track 10 thus extending in a straight path along the straight track segments 12 and in a curved path along the curved track segments 12. The rails 20 may be thin with respect to the width of the track 10 and span only a partial width of the surface of the track 10 on which it is attached. Each mover 100 includes complementary rollers 110 to engage the track portion 24 of the rail 20 for movement along the track 10.

Figure 4:
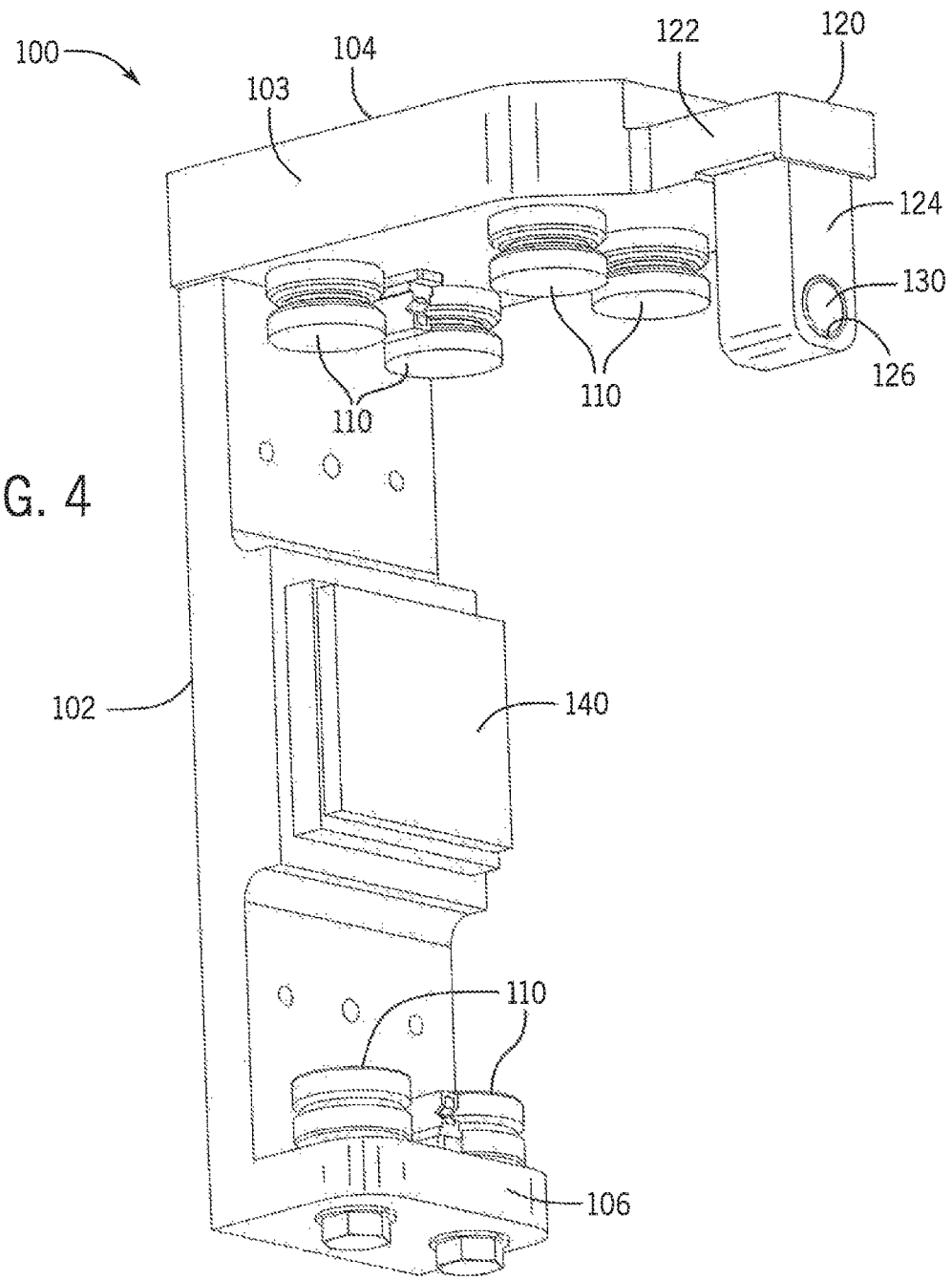
FIG. 4 is an isometric view of a mover from the transport system of FIG. 1.
Figure 5:
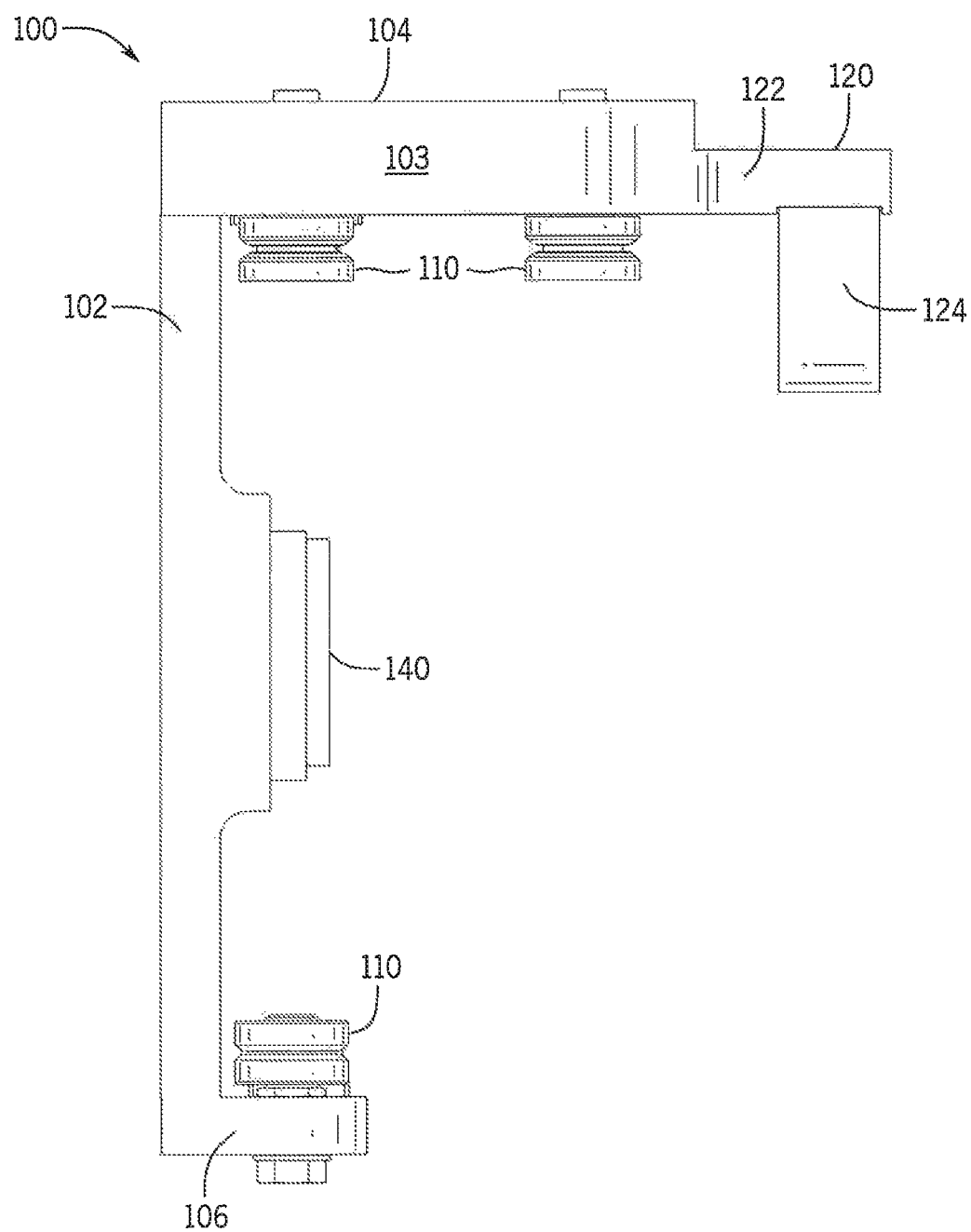
FIG. 5 is a side elevation view of the mover of FIG. 4.
Figure 6:
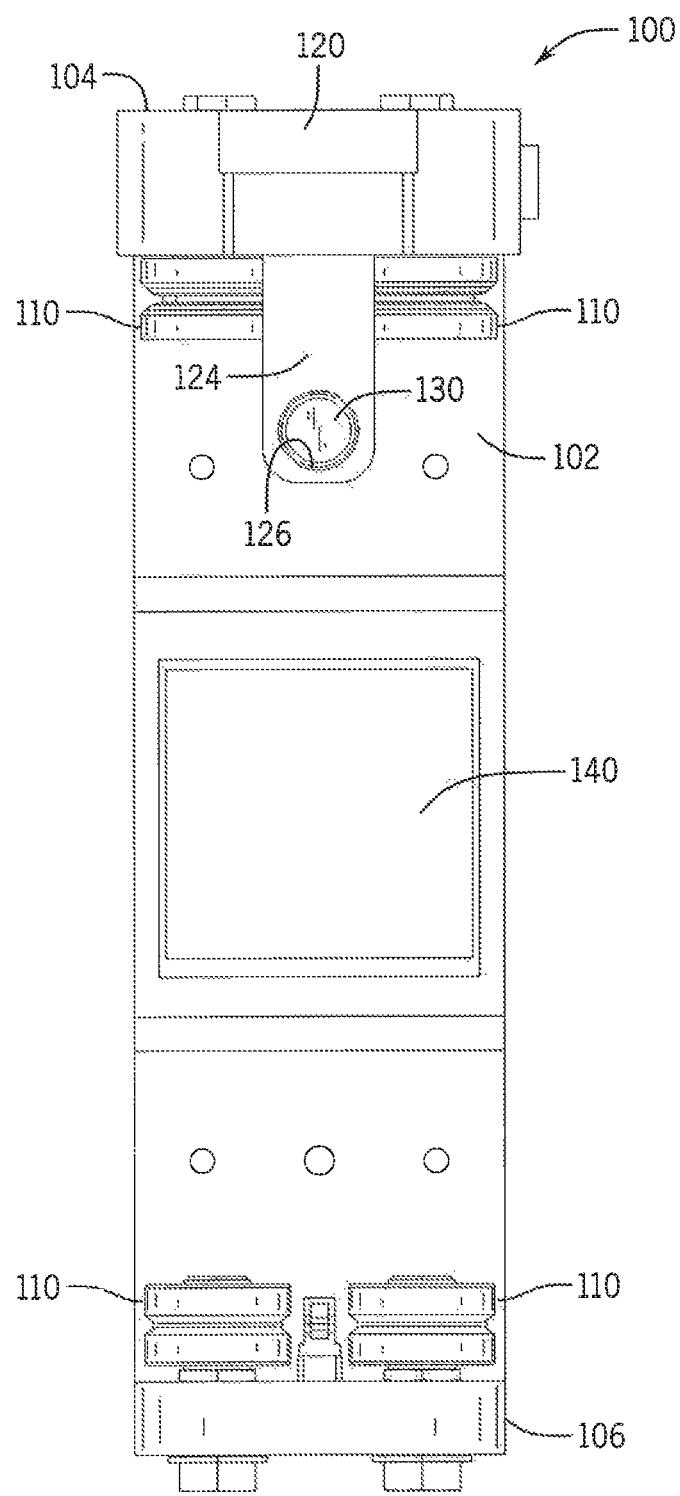
FIG. 6 is a front elevation view of the mover of FIG. 4.

One or more movers 100 are mounted to and movable along the rails 20 on the track 10. With reference next to FIGS. 4-6, an exemplary mover 100 is illustrated. Each mover 100 includes a side member 102, a top member 104, and a bottom member 106. The side member 102 extends for a height at least spanning a distance between the rail 20 on the top surface 11 of the track 10 and the rail 20 on the bottom surface 13 of the track 10 and is oriented generally parallel to a side surface 21 when mounted to the track 10. The top member 104 extends generally orthogonal to the side member 102 at a top end of the side member 102 and extends across the rail 20 on the top surface 11 of the track 10. The top member 104 includes a first segment 103, extending orthogonally from the side member 102 for the width of the rail 20, which is generally the same width as the side member 102. A set of rollers 110 are mounted on the lower side of the first segment 103 and are configured to engage the track portion 24 of the rail 20 mounted to the upper surface 11 of the track segment. According to the illustrated embodiment two pairs of rollers 110 are mounted to the lower side of the first segment 103 with a first pair located along a first edge of the track portion 24 of the rail and a second pair located along a second edge of the track portion 24 of the rail 20. The first and second edges and, therefore, the first and second pairs of rollers 110 are on opposite sides of the rail 20 and positively retain the mover 100 to the rail 20. The bottom member 106 extends generally orthogonal to the side member 102 at a bottom end of the side member 102 and extends for a distance sufficient to receive a third pair of rollers 110 along the bottom of the mover 100. The third pair of rollers 110 engage an outer edge of the track portion 24 of the rail 20 mounted to the lower surface 13 of the track segment. Thus, the mover 100 rides along the rails 20 on the rollers 110 mounted to both the top member 104 and the bottom member 106 of each mover 100. The top member 104 also includes a second segment 120 which protrudes from the first segment 103 an additional distance beyond the rail 20 and is configured to hold a position magnet 130. According to the illustrated embodiment, the second segment 120 of the top member 104 includes a first portion 122 extending generally parallel to the rail 20 and tapering to a smaller width than the first segment 103 of the top member 104. The second segment 120 also includes a second portion 124 extending downward from and generally orthogonal to the first portion 122. The second portion 124 extends downward a distance less than the distance to the upper surface 11 of the track segment but of sufficient distance to have the position magnet 130 mounted thereto. According to the illustrated embodiment, a position magnet 130 is mounted within a recess 126 on the second portion 124 and is configured to align with a track sensor 150 mounted to the top surface 11 of the track segment.

Figure 2:
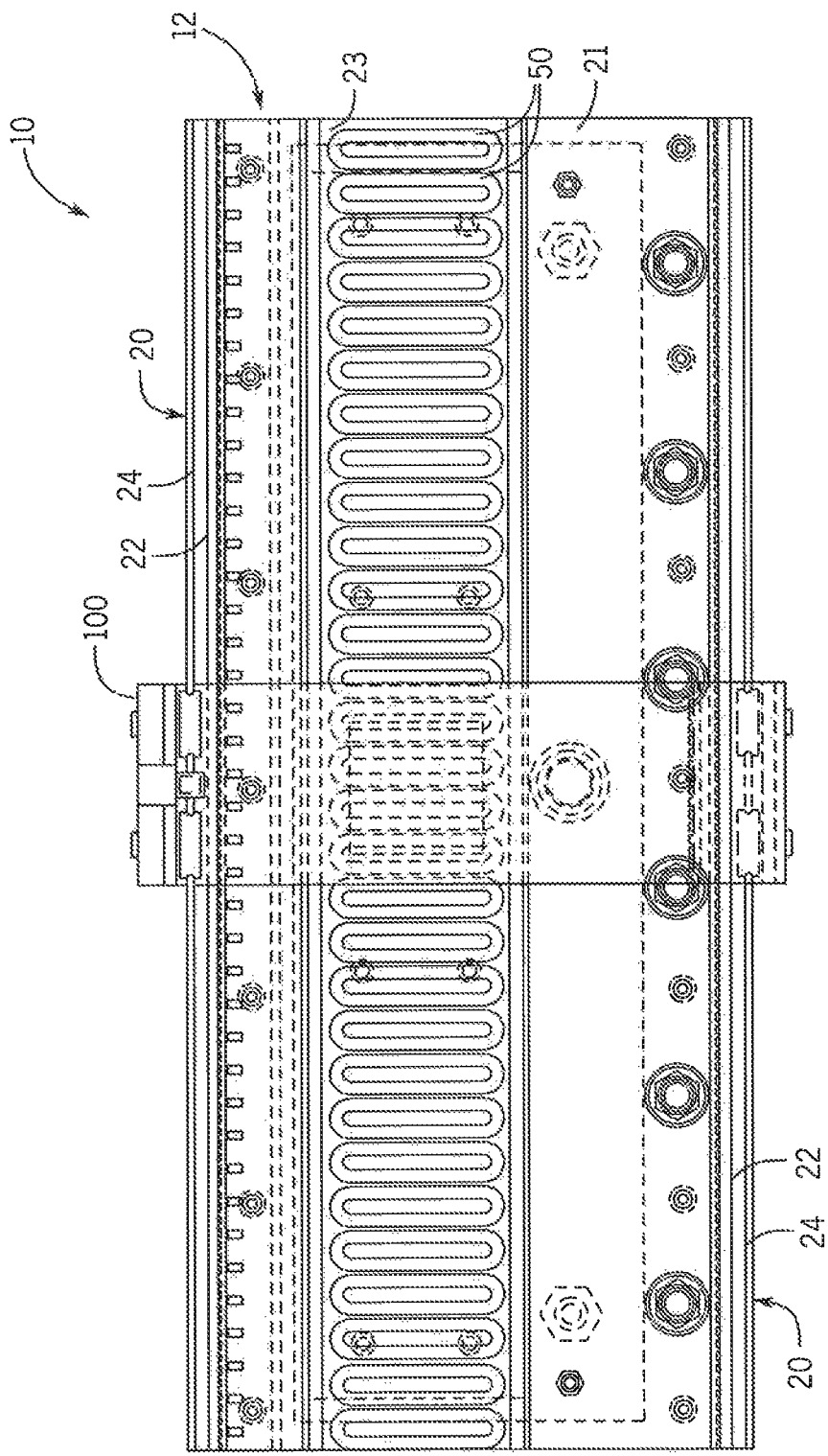
FIG. 2 is a partial side elevation view of one segment of the transport system of FIG. 1 illustrating activation coils distributed along one surface of the track segment.

A linear drive system is incorporated in part on each mover 100 and in part within each track segment 12 to control motion of each mover 100 along the segment. On each mover 100, the linear drive system includes multiple drive magnets 140 mounted to the side member 102. The drive magnets 140 can be arranged in a block along an inner surface of the side member 102 with separate magnet segments alternately having a north pole, N, and south pole, S, pole facing the track segment. The drive magnets 140 are typically permanent magnets, and two adjacent magnet segments including a north pole and a south pole may be considered a polo-pair. The drive magnets 140 are mounted on the inner surface of the side member 102 and when mounted to the track 10 are spaced apart from a series of coils 50 extending along the track 10. As shown in FIG. 3, an air gap 141 is provided between each set of drive magnets 140 and the coils 50 along the track 10. On the track 10, the linear drive system includes a series of parallel coils 50 spaced along each track segment 12 as shown in FIG. 2. According to the illustrated embodiment, each coil 50 is placed in a channel 23 extending longitudinally along one surface of the track segment 12. The electromagnetic field generated by each coil 50 spans the air gap and interacts with the drive magnets 140 mounted to the mover 100 to control operation of the mover 100.

Figure 7:
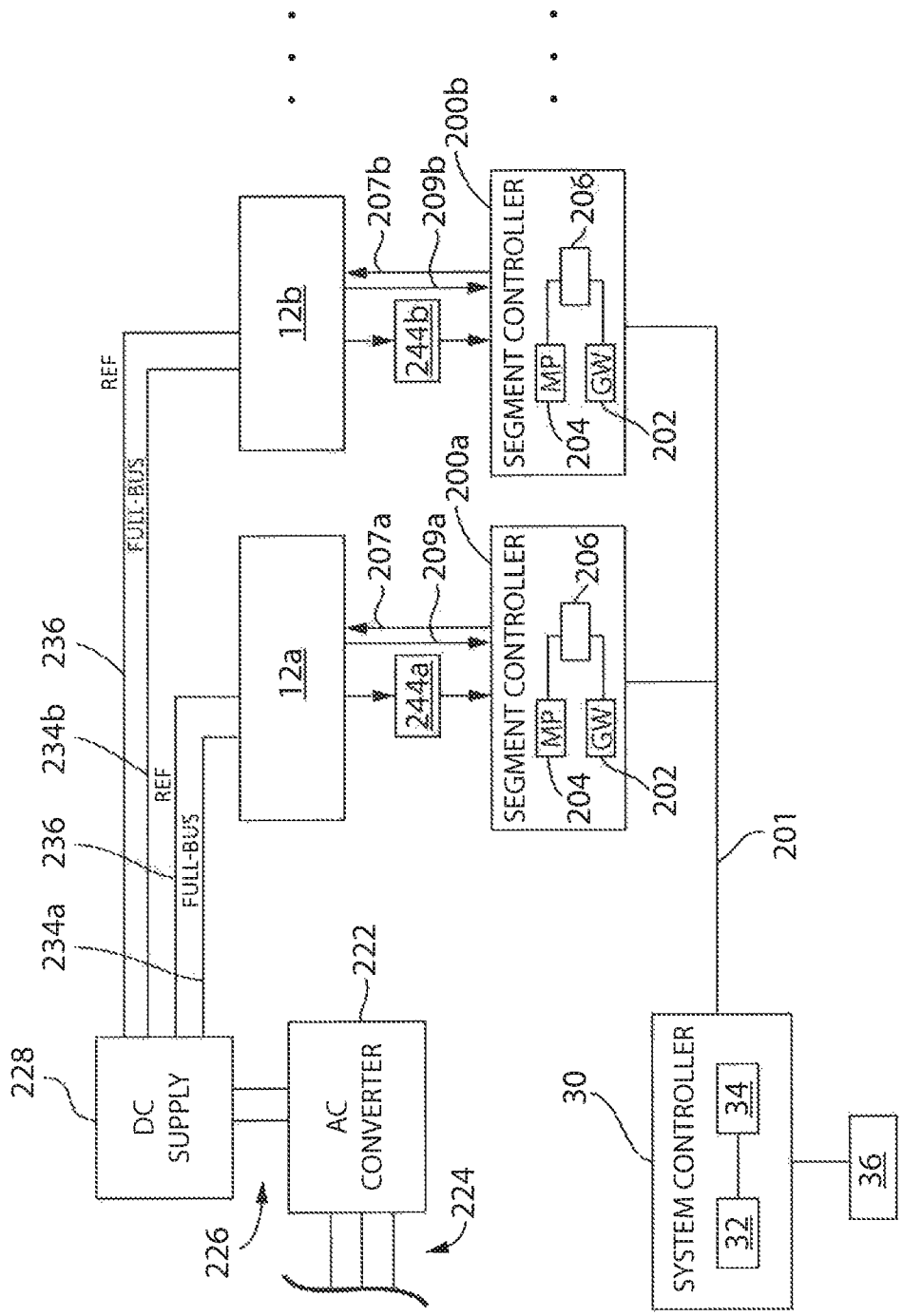
FIG. 7 is a block diagram representation of an exemplary power and control system for the transport system FIG. 1.

Turning next to FIG. 7, an exemplary power and control system for the track 10 and linear drive system is illustrated. A segment controller 200 is mounted within each segment 12, with two segment controllers 200 shown by way of example. The segment controller 200 receives command signals from a system controller 30 and generates switching signals for motor phases or power segments 210 (see FIG. 8), with six power segments 210 for each segment 12, shown by way of example, which, in turn, control activation corresponding coils 50. Activation of the coils 50 are controlled by switches in the power segments 210 to drive and position movers 100 along the track segment 12, according to Pulse Width Modulation (PWM) command signals received from the system controller 30. In a preferred embodiment, each segment 12 could include at least twelve power segments 210 with corresponding coils 50 spaced along the track.

The illustrated motion control system includes a system controller 30 having a processor 32 and a memory device 34. It is contemplated that the processor 32 and memory device 34 may each be a single electronic device or formed from multiple devices. The processor 32 may be a microprocessor. Optionally, the processor 32 and/or the memory device 34 may be integrated on a field programmable array (FPGA) or an application specific integrated circuit (ASIC). The memory device 34 may include volatile memory, non-volatile memory, or a combination thereof. The system controller 30 could be a Programmable Logic Controller (PLC). A user interface 36 is provided for an operator to configure the system controller 30 and to load or configure desired motion profiles for the movers 100 on the system controller 30. It is contemplated that the system controller 30 and user interface 36 may be a single device, such as a laptop, notebook, tablet or other mobile computing device. Optionally, the user interface 36 may include one or more separate devices such as a keyboard, mouse, display, touchscreen, interface port, removable storage medium or medium reader and the like for receiving information from and displaying information to a user. Optionally, the system controller 30 and user interface 36 may be integrated into an industrial computer mounted within a control cabinet and configured to withstand harsh operating environments. It is contemplated that still other combinations of computing devices and peripherals as would be understood in the art may be utilized or incorporated into the system controller 30 and user interface 36 without deviating from the scope of the invention.

One or more programs may be stored in the memory device 34 for execution by the processor 32. The system controller 30 receives one or more motion profiles for the movers 100 to follow along the track 10. A program executing on the processor 32 is in communication with a segment controller 200 on each track segment 12 via a control network 201, such as an EtherNet/IP network. The system controller 30 may transfer a desired motion profile to each segment controller 200 or, optionally, the system controller 30 may perform some initial processing based on the motion profile to transmit a segment of the motion profile to each segment controller 200 according to the portion of the motion profile to be executed along that segment. Optionally, the system controller 30 may perform still further processing on the motion profile and generate a desired switching sequence for each segment 12 that may be transmitted to the segment controller 200.

A gateway 202 in each segment controller 200 receives the communications from the system controller 30 and passes the communication to a processor 204 executing in the segment controller 200. The processor may be a microprocessor. Optionally, the processor 204 and/or a memory device 206 within the segment controller 200 may be integrated on a field programmable array (FPGA) or an application specific integrated circuit (ASIC). It is contemplated that the processor 204 and memory device 206 may each be a single electronic device or formed from multiple devices. The memory device 206 may include volatile memory, non-volatile memory, or a combination thereof. The segment controller 200 receives the motion profile, or portion thereof, or the switching sequence transmitted from the system controller 30 and utilizes the motion profile or switching sequence to control movers 100 present along the track segment 12 controlled by that system controller 30.

Figure 8:
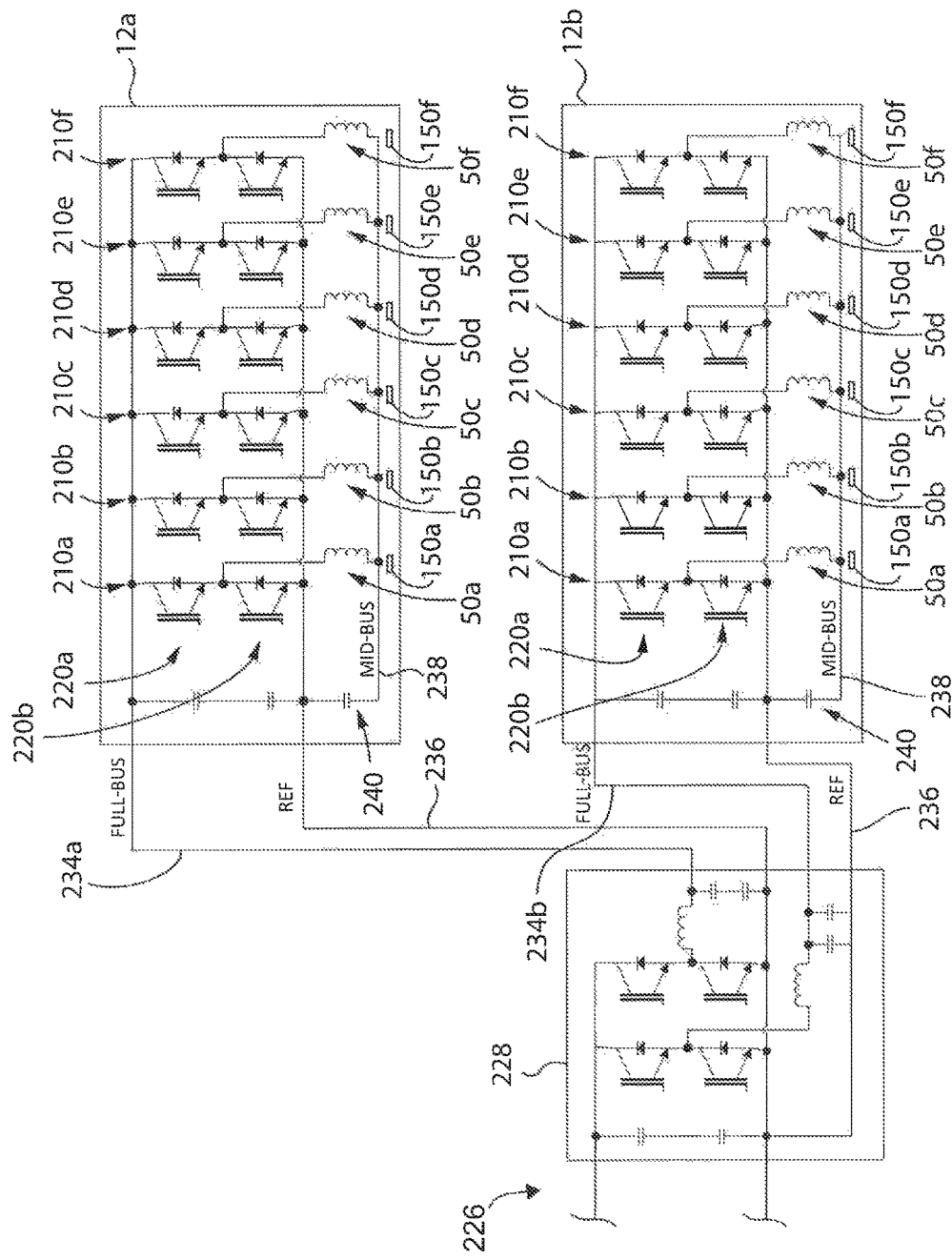
FIG. 8 is an exemplary schematic for a portion of the power system of FIG. 7 in accordance with a first aspect of the invention.

With additional reference to FIG. 8, each segment controller 200 can generate PWM switching signals 207 to control operation of switching devices (switches) mounted within a segment 12. The processor 204 can receive feedback signals 209 from track sensors 150 detecting position magnets 130 in movers 100, thereby providing an indication of the current operating conditions of power segments 210 and/or coils 50 connected to the power segments 210. The switches within each power segment 210 are connected between a power source and the coils 50. The switching signals are generated to sequentially energize coils 50 along a track segment, where the energized coils 50 create an electromagnetic field that interacts with the drive magnets 140 on each mover 100 to control motion of the movers 100 along the corresponding track segment 12. In particular, the switching signals 207 control operation of switches 220 in communication with the drive coils 50, including upper switches 220a and lower switches 220b in the power segments 210. The switches 220 may be solid-state devices that are activated by the switching signals 207, including, hut not limited to, transistors, such as insulated-gate bipolar transistors, metal oxide semiconductor field effect transistors, bipolar junction transistors, or the like.

According to the illustrated embodiment, an AC converter 222 (FIG. 7) can receive a single or multi-phase AC voltage 224 from a power grid. The AC converter 222, in turn, can provide a DC voltage 226 using, for example, a rectifier front end, at input terminals of a DC supply 228, which could be a DC-to-DC buck converter. The DC supply 228, in turn, can provide at input terminals of segments 12 a distributed DC bus, including: a full-bus DC voltage rail 234 configured to provide DC power at a full-bus voltage ("full-bus"), such as 400 V; and a DC reference voltage rail 236 configured to provide a DC reference ("DC-," "DC Reference," or "Ref") or common, such as ground (0 V), providing a current return path, to segments 12. In one configuration, the DC supply 228 can provide: a first full-bus DC voltage rail 234a and the DC reference 236 to the segment 12a, and a second hill-bus DC voltage rail 234b and the DC reference 236 to the segment 12b. Although a single DC supply 228 providing DC power to two segments 12 is shown by way of example, alternative aspects of the invention could include multiple DC supplies 228 providing DC power to multiple segments 12, and/or a DC supply 228 having more outputs for providing DC power, such as more full-bus DC voltage rails 234, within the scope of the invention.

In each power segment 210, the processor 204 can drive the switching signals 207 to control the various switches 220 to provide power to respective coils 50 for propelling a mover 100 while continuously receiving feedback signals 209 for determining positions of the mover 100. For example, in a first power segment 210a of the segment 12a, the processor 204 of the segment controller 200a can drive the upper and lower switches 220a and 220b, respectively, to control a corresponding coil 50a in the first power segment 210a to propel the mover 100. The processor 204 can detect movement of the mover 100 from the first power segment 210a toward an area corresponding to the second power segment 210b by a track sensor 150a detecting a position magnet 130 of a mover 100 becoming distal to coil 50a, and generating a corresponding feedback signal 209a', a track sensor 150b detecting the position magnet 130 of the mover 100 becoming proximal to coil 50b, and generating a corresponding feedback signal 209a". The processor 204 can then drive the upper and lower switches 220a and 220b, respectively, to control a corresponding coil 50b in the second power segment 210b to continue propelling the mover 100, according to a predetermined motion profile. In a preferred embodiment, at least two coils 50 could be used to propel any given mover 100 as required by the motion profile.

In each power segment 210, the upper switches 220a can be arranged between the full-bus DC voltage rail 234 and the coils 50, with each upper switch 220a being configured to selectively connect a drive coil 50 to the full-bus DC voltage rail 234. Also, in each power segment 210, the lower switches 220b can be arranged between the DC reference 236 and the coils 50, with each lower switch 220b being configured to selectively connect a drive coil 50 to the DC reference 236. The coils 50 can be arranged between the switches 220 on an upper side and a common connection that is an internally generated mid-bus DC voltage rail 238 on a lower side. Accordingly, the switches 220 in each power segment 210 can be configured to connect a coil 50 in the power segment between the mid-bus DC voltage rail 238 and the full-bus DC voltage rail 234, causing a positive current flow in the coil 50 from the mid-bus DC voltage rail 238 to the full-bus DC voltage rail 234, or between the mid-bus DC voltage rail 238 and the DC reference 236, causing a negative current flow in the coil 50 from the DC reference 236 to the mid-bus DC voltage rail 238, in various states.

The track sensors 150 can be spaced along the track segment 12, with each track sensor 150 being proximal to a coil 50. The track sensors 150 could be, for example, Hall effect sensors configured to detect position magnets 130 of movers 100. Accordingly, the track sensors 150 can detect movers when proximal to corresponding coils 50, and indicate such detection through corresponding feedback signals 209.

In accordance with an aspect of the invention, when a track sensor 150 does not detect a mover 100 as being proximal to a coil 50, upper and lower switches 220a and 220b, respectively, in power segment 210 for that coil 50 can be controlled to provide a regulated mid-bus voltage corresponding to half the full bus voltage through that coil 50, such as 200 V, from the full-bus DC voltage rail 234, to the mid-bus DC voltage rail 238. However, when a track sensor 150 does detect a mover 100 as being proximal to a coil 50, the upper and lower switches 220a and 220b, respectively, in the power segment 210 for that coil 50 can be controlled to provide power to the coil 50 to electromagnetically propel the mover 100. Accordingly, coils 50 in segments 12 that are normally used to propel movers 100 along the track when such movers 100 are nearby can be used to internally generate the mid-bus DC voltage rail 238 for the segment 12 when not being used to propel the movers 100. Such coils 50 not being used to propel movers 100 are considered "idle" and available for mid-bus voltage generation. When movers 100 are again nearby coils 50, operation of the switches 220 will change for such coils 50 from generation of the mid-bus DC voltage rail 238 to propulsion of the movers 100. As a result, the DC supply 228 can be used more efficiently in the system by not requiring the DC supply 228 to generate a mid-bus voltage in addition to a full-bus voltage.

A capacitor 240 can be arranged between the coils 50 and the DC reference 236 in each segment 12. The capacitor 240 can be sized to complement the coil 50 as a suitable capacitor for operation as a single-stage L-C filter for a power supply, with the coil 50 as the inductor, during generation of the mid-bus DC voltage rail 238. As a result, the mid-bus DC voltage rail 238 can be produced with filtering to remove AC voltage or ripple.

Figure 9:
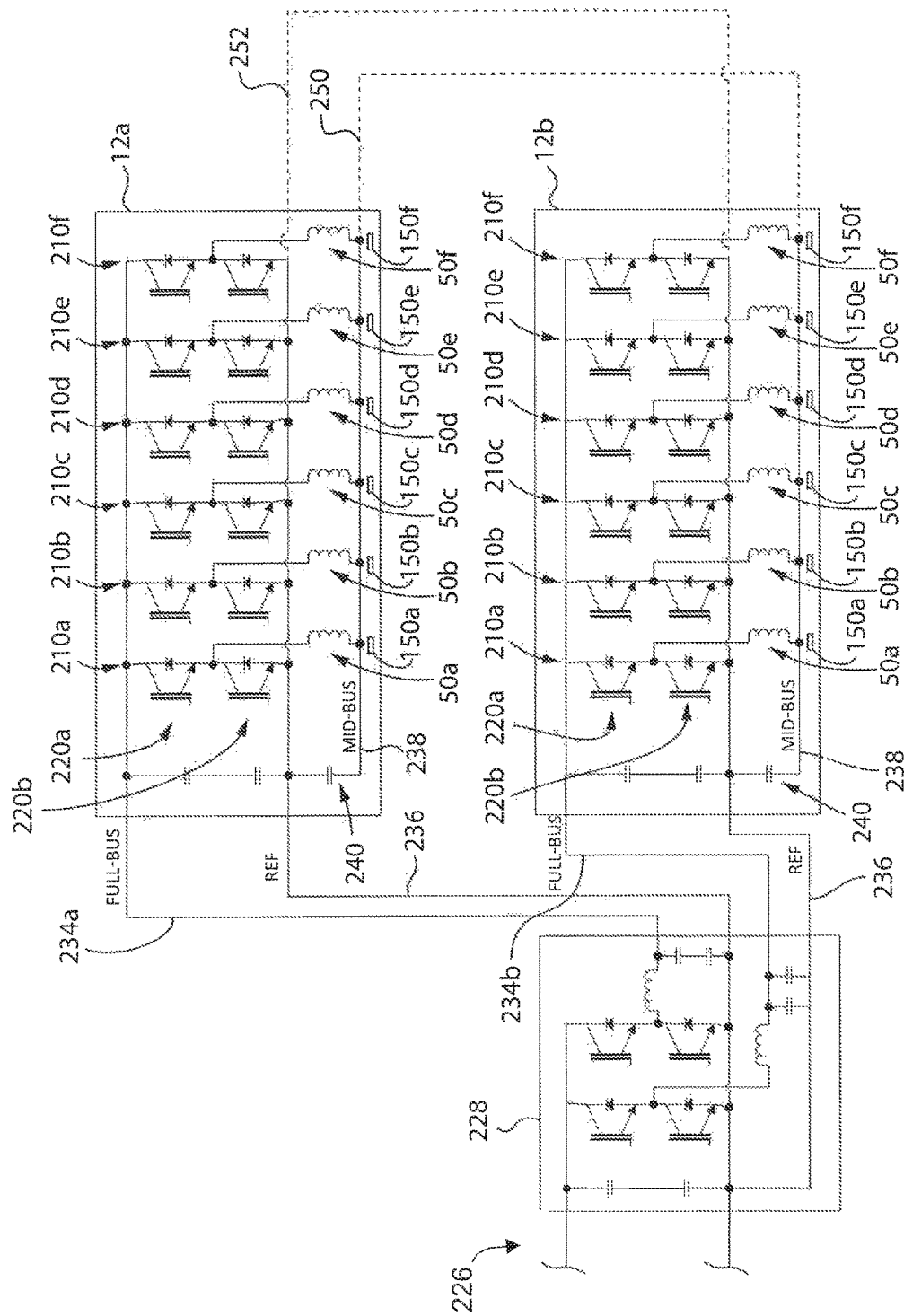
FIG. 9 is an exemplary schematic for a portion of the power system of FIG. 7 in accordance with a second aspect of the invention.

It should be appreciated that the mid-bus DC voltage rail 238 can be electrically isolated between segments 12. However, referring now to FIG. 9, in another aspect, the mid-bus DC voltage rail 238 of the segment 12a (the first full-bus DC voltage rail 234a) could be optionally electrically joined at connection 250 to the mid-bus DC voltage rail 238 of the segment 12b (the second full-bus DC voltage rail 234b), while the full-bus DC voltage rail 234 remains electrically isolated between the segments 12a and 12b. This could allow sharing the responsibility for mid-bus voltage generation among multiple segments 12, so that multiple movers 100 on a single segment 12, utilizing most or all of the coils 50 of that segment 12, would not cause that track section to lose the mid-bus voltage. Moreover, the DC reference 236 of the segment 12a could be similarly electrically joined at connection 252 to the DC reference 236 of the segment 12b.

In addition, the system controller 30 can be implemented to control the coils 50, through the segment controllers 200, to operate together, so that idle coils in the system are efficiently used to produce the mid-bus voltage across the track 10. This may be preferable to attempting to control the coils 50 independently from different devices, which could result in slightly different information among the different devices causing the devices to oppose one another. Accordingly, the system controller 30 can provide inter-section communications to coordinate control of the coils 50 that are idle, through the segment controllers 200, for proper voltage regulation.

It should be understood that the invention is not limited in its application to the details of construction and arrangements of the components set forth herein. The invention is capable of other embodiments and of being practiced or carried out in various ways. Variations and modifications of the foregoing are within the scope of the present invention. It also being understood that the invention disclosed and defined herein extends to all alternative combinations of two or more of the individual features mentioned or evident from the text and/or drawings. All of these different combinations constitute various alternative aspects of the present invention. The embodiments described herein explain the best modes known for practicing the invention and will enable others skilled in the art to utilize the invention.

What is claimed is:

1. A linear motor drive system comprising:
   a DC power supply configured to provide:
      a first DC voltage rail providing a full bus voltage; and
      a DC reference; and
   a track segment defining a path along which a mover travels, the track segment receiving power from the DC power supply for electromagnetically propelling a mover, the track segment including:
      a plurality of drive coils spaced along the track segment, the plurality of drive coils being coupled to a second DC voltage rail;
      a plurality of upper switches arranged between the first DC voltage rail and the plurality of drive coils, each upper switch being configured to selectively connect a drive coil to the first DC voltage rail;
      a plurality of lower switches arranged between the DC reference and the plurality of drive coils, each lower switch being configured to selectively connect a drive coil to the DC reference; and
      a plurality of track sensors spaced along the track segment, each track sensor being configured to detect a mover when proximal to a drive coil,
   wherein upper and lower switches of the pluralities of upper and lower switches corresponding to a drive coil are controlled to provide a mid-bus voltage corresponding to half the full bus voltage through the drive coil to the second DC voltage rail when a track sensor does not detect a mover proximal to the drive coil, and wherein the upper and lower switches of the pluralities of upper and lower switches corresponding to a drive coil are controlled to provide power to the drive coil between the first and second DC voltage rails to electromagnetically propel a mover when the track sensor detects a mover is proximal to the drive coil.

2. The system of claim 1, wherein the track segment is a first track segment, and further comprising a second track segment receiving power from the DC power supply, wherein the DC power supply is further configured to provide the DC reference and a third DC voltage rail providing DC power to the second track segment.

3. The system of claim 2, wherein the second DC voltage rail of the first track segment is connected to the second DC voltage rail of the second track segment.

4. The system of claim 3, further comprising a controller executing a program stored in a non-transient medium to coordinate control of the drive coils in the first and second track segments to provide the mid-bus voltage.

5. The system of claim 1, wherein the track segment further include a capacitor arranged between the DC reference and the second DC voltage rail, wherein the upper and lower switches are controlled to provide the mid-bus voltage through the drive coil to the second DC voltage rail using the drive coil and the capacitor as an LC filter.

6. The system of claim 1, wherein the switches of the pluralities of upper and lower switches are controlled by Pulse Width Modulation (PWM) signals.

7. The system of claim 1, wherein the switches of the pluralities of upper and lower switches are insulated-gate bipolar transistors.

8. The system of claim 1, wherein the track segment includes at least twelve drive coils with at least two of the twelve drive coils being used to electromagnetically propel a mover when detected.

9. The system of claim 1, wherein the first DC voltage rail provides at least 400 Volts.

10. A linear motor drive system comprising:
a DC power supply configured to provide:
a first DC voltage rail providing a full bus voltage; and
a DC reference;
a plurality of movers, each mover including at least one position magnet; and
a track segment defining a path along which the plurality of movers travel, the track segment receiving power from the DC power supply for electromagnetically propelling the movers, the track segment including:
a plurality of drive coils spaced along the track segment, the plurality of drive coils being coupled to a second DC voltage rail;
a plurality of upper switches arranged between the first DC voltage rail and the plurality of drive coils, each upper switch being configured to selectively connect a drive coil to the first DC voltage rail;
a plurality of lower switches arranged between the DC reference and the plurality of drive coils, each lower switch being configured to selectively connect a drive coil to the DC reference; and
a plurality of track sensors spaced along the track segment, each track sensor being configured to detect a mover when proximal to a drive coil by detecting the at least one position magnet,
wherein upper and lower switches of the pluralities of upper and lower switches corresponding to a drive coil are controlled to provide a mid-bus voltage corresponding to half the full bus voltage through the drive coil to the second DC voltage rail when a track sensor does not detect a mover proximal to the drive coil, and
wherein the upper and lower switches of the pluralities of upper and lower switches corresponding to a drive coil are controlled to provide power to the drive coil between the first and second DC voltage rails to electromagnetically propel a mover when the track sensor detects a mover is proximal to the drive coil.

11. The system of claim 10, wherein the track segment is a first track segment, and further comprising a second track segment receiving power from the DC power supply, wherein the DC power supply is further configured to provide the DC reference and a third DC voltage rail providing DC power to the second track segment.

12. The system of claim 11, wherein the second DC voltage rail of the first track segment is connected to the second DC voltage rail of the second track segment.

13. The system of claim 12, further comprising a controller executing a program stored in a non-transient medium to coordinate control of the drive coils in the first and second track segments to provide the mid-bus voltage.

14. The system of claim 10, wherein the track segment further includes a capacitor arranged between the DC reference and the second DC voltage rails, wherein the upper and lower switches are controlled to provide the mid-bus voltage through the drive coil to the second DC voltage rail using the drive coil and the capacitor as an LC filter.

15. The system of claim 10, wherein the switches of the pluralities of upper and lower switches are controlled by Pulse Width Modulation (PWM) signals.

16. The system of claim 10, wherein the switches of the pluralities of upper and lower switches are insulated-gate bipolar transistors.

17. The system of claim 10, wherein the track segment includes at least twelve drive coils with at least two of the twelve drive coils being used to electromagnetically propel movers of the plurality of movers when detected.

18. The system of claim 10, wherein the first DC voltage rail provides at least 400 Volts.

* * * * *